(12) United States Patent
Hong et al.

(10) Patent No.: US 7,674,360 B2
(45) Date of Patent: Mar. 9, 2010

(54) MECHANISM FOR VARYING THE SPACING BETWEEN SPUTTER MAGNETRON AND TARGET

(75) Inventors: Ilyoung Richard Hong, San Jose, CA (US); Donny Young, San Francisco, CA (US); Michael Rosenstein, Sunnyvale, CA (US); Robert B. Lowrance, Los Gatos, CA (US); Daniel C. Lubben, San Jose, CA (US); Michael Andrew Miller, Sunnyvale, CA (US); Peijun Ding, Saratoga, CA (US); Sreekrishnan Sankaranarayan, Santa Clara, CA (US); Goichi Yoshidome, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 965 days.

(21) Appl. No.: 10/942,273

(22) Filed: Sep. 16, 2004

(65) Prior Publication Data
US 2005/0133365 A1     Jun. 23, 2005

Related U.S. Application Data

(60) Provisional application No. 60/529,209, filed on Dec. 12, 2003.

(51) Int. Cl.
| | |
|---|---|
| C25B 9/00 | (2006.01) |
| C25B 11/00 | (2006.01) |
| C25B 13/00 | (2006.01) |
| C23C 14/00 | (2006.01) |

(52) U.S. Cl. ............................ 204/298.2; 204/298.01; 204/298.16; 204/298.17

(58) Field of Classification Search .............. 204/192.1, 204/192.12, 192.13, 192.15, 192.38, 298.01, 204/298.16, 298.17, 298.2
See application file for complete search history.

(56) References Cited

U.S. PATENT DOCUMENTS 4,309,266 A   *   1/1982   Nakamura et al. ..... 204/192.12

(Continued)

FOREIGN PATENT DOCUMENTS

JP     60 197874 A     10/1985

(Continued)

OTHER PUBLICATIONS

Merriam-Webster Online (http://www.merriam-webster.com/dictionary/azimuthally) [Accessed on Aug. 25, 2008].*

(Continued)

*Primary Examiner*—Jennifer K Michener
*Assistant Examiner*—Michael Band
(74) *Attorney, Agent, or Firm*—Law Offices of Charles Guenzer

(57) ABSTRACT

A lift mechanism for and a corresponding use of a magnetron in a plasma sputter reactor. A magnetron rotating about the target axis is controllably lifted away from the back of the target to compensate for sputter erosion, thereby maintaining a constant magnetic field and resultant plasma density at the sputtered surface, which is particularly important for stable operation with a small magnetron, for example, one executing circular or planetary motion about the target axis. The lift mechanism can include a lead screw axially fixed to the magnetron support shaft and a lead nut engaged therewith to raise the magnetron as the lead nut is turned. Alternatively, the support shaft is axially fixed to a vertically moving slider. The amount of lift may be controlled according a recipe based on accumulated power applied to the target or by monitoring electrical characteristics of the target.

22 Claims, 10 Drawing Sheets

U.S. PATENT DOCUMENTS

| | | | | |
|---|---|---|---|---|
| 4,426,264 A | * | 1/1984 | Munz et al. | 204/192.13 |
| 4,444,643 A | * | 4/1984 | Garrett | 204/298.2 |
| 4,714,536 A | * | 12/1987 | Freeman et al. | 204/298.2 |
| 4,734,183 A | * | 3/1988 | Wirz et al. | 204/298.2 |
| 4,927,513 A | | 5/1990 | Schultheiss et al. | 204/192.13 |
| 5,079,481 A | | 1/1992 | Moslehl | 315/111.41 |
| 5,160,595 A | | 11/1992 | Hauzer et al. | 204/192.38 |
| 5,188,717 A | * | 2/1993 | Broadbent et al. | 204/192.12 |
| 5,252,194 A | | 10/1993 | Demaray et al. | 204/298.2 |
| 5,482,610 A | * | 1/1996 | Wolf et al. | 204/298.19 |
| 5,540,821 A | * | 7/1996 | Tepman | 204/192.13 |
| 5,855,744 A | | 1/1999 | Halsey et al. | 204/192.12 |
| 6,030,511 A | | 2/2000 | Shinmura | 204/192.15 |
| 6,193,854 B1 | | 2/2001 | Lai et al. | 204/192.12 |
| 6,306,265 B1 | | 10/2001 | Fu et al. | 204/192.12 |
| 6,309,525 B2 | | 10/2001 | Futagawa et al. | 204/298.11 |
| 6,398,929 B1 | | 6/2002 | Chiang et al. | |
| 6,406,599 B1 | | 6/2002 | Subramani et al. | 204/298.09 |
| 6,413,383 B1 | | 7/2002 | Chiang et al. | 204/192.13 |
| 6,416,639 B1 | | 7/2002 | De Bosscher et al. | 204/298.2 |
| 6,451,177 B1 | | 9/2002 | Gopalraja et al. | 204/192.12 |
| 6,461,485 B2 | | 10/2002 | Mizouchi et al. | 204/192.15 |
| 6,494,999 B1 | | 12/2002 | Herrera et al. | 204/192.12 |
| 6,521,106 B1 | | 2/2003 | Actor et al. | 204/298.11 |
| 6,623,606 B2 | | 9/2003 | Hurwitt et al. | 204/192.13 |
| 2003/0217913 A1 | | 11/2003 | Hong et al. | 204/298.2 |

FOREIGN PATENT DOCUMENTS

| | | |
|---|---|---|
| JP | 02 107763 A | 4/1990 |
| JP | 2107763 | 4/1990 |
| JP | 02263113 A * | 10/1990 |

OTHER PUBLICATIONS

Merriam-Webster Online (http://www.merriam-webster.com/dictionary/epicyclic) [Accessed on Aug. 25, 2008].* http://www.merriam-webster.com/dictionary/azimuthal [Accessed on Jul. 1, 2009].*

* cited by examiner

MECHANISM FOR VARYING THE SPACING BETWEEN SPUTTER MAGNETRON AND TARGET

RELATED APPLICATIONS

This application claims benefit of U.S. provisional application, Ser. No. 60/529,209, filed Dec. 12, 2003. It also is related to concurrently filed U.S. patent application Ser. No. 10/942,358 and entitled COMPENSATION OF SPACING BETWEEN MAGNETRON AND SPUTTER TARGET.

FIELD OF THE INVENTION

The invention relates generally to sputter deposition of materials. In particular, the invention relates to a movable magnetron that creates a magnetic field to enhance sputtering.

BACKGROUND ART

Sputtering, alternatively called physical vapor deposition (PVD), is the most prevalent method of depositing layers of metals and related materials in the fabrication of integrated circuits. The more conventional type of sputtering, as originally applied to integrated circuits as well as to other applications, deposits upon a workpiece a planar layer of the material of the target. However, the emphasis has recently changed in the use of sputtering for the fabrication of integrated circuits because vertical interconnects through inter-level dielectrics having the high aspect ratios now being used present a much greater challenge than the horizontal interconnects. Furthermore, the horizontal interconnects are being increasingly implemented by electrochemically plating copper into horizontally extending trenches while sputtering is being reserved for liner layers deposited onto the sidewalls in the holes in which the vertical interconnects are formed or also deposited onto the walls of the horizontal trenches.

It has long been known that sputtering rates can be increased by the use of a magnetron 10, illustrated in the schematic cross-sectional view of FIG. 1, positioned in back of a sputtering target 12. The magnetron projects a magnetic field 14 across the face of the target 12 to trap electrons and hence increase the plasma density. The magnetron 10 typically includes at least two magnets 16, 18 of anti-parallel magnetic polarities perpendicular to the face of the target 12. A magnetic yoke 20 supports and magnetically couples the two magnets 16, 18. The resultant increased plasma density is very effective at increasing the sputtering rate adjacent the parallel components of the magnetic field 14. However, as illustrated in the cross-sectional view of FIG. 2, an erosion region 22 develops adjacent the magnetic field, which brings a front surface 24 of the target 12 closer to the magnetron 10, which front surface 24 is the surface being currently sputtered. The erosion illustrated in FIG. 2 emphasizes an erosion pit adjacent the magnetron 10. In typical operation, the magnetron 10 is scanned over the back of the target 12 to produce a more uniform erosion pattern. Nonetheless, even if a target eroded to a planar surface, the fact remains that after erosion the surface of the target being sputtered is closer to the magnetron 10 than before erosion.

The target erosion presents several problems if the lifetime of the target 12 is to be maximized. First, the erosion pattern should be made as uniform as possible. In conventional planar sputtering, uniformity is improved by forming the magnets 16, 18 in a balanced, relatively large closed kidney-shaped ring and rotating the magnetron about the central axis of the target. Secondly, the erosion depth can be compensated by adjusting the spacing between the target and the wafer being sputter deposited, as disclosed by Tepman in U.S. Pat. No. 5,540,821. Futagawa et al. disclose a variant in U.S. Pat. No. 6,309,525. These schemes have primarily addressed the dependence of deposition rate on the separation between the wafer and the effective front face of the target 12. These approaches do not address how the erosion affects the magnetic enhancement of sputtering.

The erosion problem has been complicated by the need to produce a highly ionized sputter flux so that the ionized sputter atoms can be electrostatically attracted deep within high aspect-ratio holes and be magnetically guided, as has been explained for an SIP reactor by Fu et al. in U.S. Pat. No. 6,306,265, incorporated herein by reference in its entirety. The apparatus described therein uses a small triangularly shaped magnetron to effect self-ionized sputtering, taking into account three factors. First, it is advantageous to reduce the size of the magnetron in order to concentrate the instantaneous sputtering to a small area of the target, thereby increasing the effective target power density. Secondly, the concentrated magnetic field of the small magnetron increases the plasma density adjacent the portion of the target being sputtered, thereby increasing the ionization fraction of the target atoms being sputtered. The ionized sputter flux is effective at being attracted deep within high aspect-ratio holes in the wafer. However, the target erosion affects the effective magnetic field at the target face being sputtered, thereby changing the sputtering rate and the ionization fraction. Thirdly, the small magnetron makes uniform target sputtering that much more difficult. Various magnetron shapes, e.g., triangular have been used to increase the uniformity of sputtering, but their uniformity is not complete. Instead, annular troughs are eroded into the target even in the case of rotary magnetrons.

Two major operational effects are readily evident in the use of conventional rotary magnetrons, particularly small magnetrons. First, as illustrated in the plot 26 of the graph of FIG. 3, the deposition rate falls from its initial rate with target usage, here measured in target kilowatt-hours of cumulative power applied to the target since it was fresh. The target usage corresponds to both the amount of target that has been eroded since the target was put into service with a substantially planar and uneroded surface and to the number of wafers that have been deposited in a repetitive process. We believe that the decrease arises at least indirectly from the target erosion in which the target surface being sputtered is no longer optimized for the magnetic field since its separation from the magnetron is varying. The sputtering degradation can be compensated by either increasing the length or sputtering or Increasing the target power. Secondly, the non-uniformity of sputtering reduces the lifetime of the target to a number $N_1$ at which the erosion trough maximum approaches the target backing plate or, in the case of an integral target, a minimum thickness of the target. At this point, to prevent either sputter deposition of the backing material or breakthrough of the target, the target must be discarded even though substantial target material survives away from the erosion troughs. Costs would be saved for target purchase, operator time, and production throughput if the target lifetime is increased.

Hong et al. have presented a planetary magnetron as a solution to the uniformity problem for a high-density plasma reactor in U.S. patent application Ser. No. 10/152,494, filed May 21, 2002, now published as Application Publication 2003-0217913, and incorporated herein by reference in its entirety. As illustrated in the cross-sectional view of FIG. 4, a plasma reactor 30 has a fairly conventional lower reactor including a reactor wall 32 which supports a sputtering target 34 through an adapter 36 and isolator 38 in opposition to a pedestal electrode 40 supporting the wafer 42 to be sputter deposited with the material of the target 34. A vacuum pump system 44 pumps the vacuum chamber to a level of a few milliTorr or less while a gas source 46 supplies a working gas such as argon through a mass flow controller 48. A clamp ring 50 holds the wafer 42 to the pedestal electrode 40 although an electrostatic chuck may alternatively be used. An electrically grounded shield 52 protects the reactor walls 32 and further acts as an anode in opposition to the target 34 while a DC power supply 54 negatively biases the target 34 to a few hundred volts to excite the argon working gas into a plasma. The positively charged argon ions are accelerated to the negatively biased target 34, which they strike and dislodge or sputter atoms of the target material. The sputtered atoms are ejected from the target 34 with fairly high energy in a wide beam pattern and thereafter strike and stick to the wafer 42. With sufficiently high target power and high plasma density, a substantial fraction of the sputtered atoms are ionized. Preferably, an RF power supply 58, for instance oscillating at 13.56 MHz, biases the pedestal electrode 40 through a capacitive coupling circuit 60 such that a negative DC self-bias develops on the wafer 42, which accelerates the positively charged sputter ions deep within high-aspect ratio holes being sputter coated.

According to the invention, a magnetron 70 positioned in back of the target 34 projects its magnetic field in front of the target 34 to create a high-density plasma region 72, which greatly increases the sputtering rate of the target 34. If the plasma density is high enough, a substantial fraction of sputtered atoms are ionized, which allows additional control over the sputter deposition. Ionization effects are particularly pronounced in sputtering copper, which has a high self-sputtering yield, as copper ions are attracted back to the copper target and sputter further copper. The self-sputtering allows the argon pressure to be reduced, thereby reducing wafer heating by argon ions and reducing argon scattering of copper atoms, whether ionized or neutral, as they travel from the target 34 to the wafer 42.

In the described embodiment, the magnetron 70 is substantially circular and includes an inner magnetic pole 74 of one magnetic polarization with respect to and extending along a central axis 76 of the chamber 32 as well as the target 34 and pedestal electrode 40. It further includes an annular outer pole 78 surrounding the inner pole 74 and of the opposed magnetic polarity along the central axis 76. A magnetic yoke 80 magnetically couples the two poles 74, 78 and is supported on a carrier 81. The total magnetic intensity of the outer pole 78 is substantially greater than that of the inner pole 74, for example by a factor of greater than 1.5 or 2.0, to produce an unbalanced magnetron which projects its unbalanced magnetic portion towards the wafer 42 to thereby confine the plasma and also guide sputtered ions towards the wafer 42. Typically, the outer pole 78 is composed of plural cylindrical magnets arranged in a circle and having a common annular pole piece on the side facing the target 34. The inner pole 74 may be composed of one or more magnets, preferably with a common pole piece. Other forms of magnetrons are encompassed by the invention.

The high plasma densities achieved by this configuration as well as that of Fu et al. are achieved in part by minimizing the area of the magnetron 70. The encompassing area of the magnetron 70 is typically less than 10% of the area of the target 34 being scanned by the magnetron 70. The magnetron/target area ratio may be less than 5% or even less than 2% if uniform sputtering is otherwise maintained. As a result, only a small area of the target 34 is subject to an increased target power density and resultant intensive sputtering. That is, the sputtering at any instant of time is highly non-uniform. To compensate for the non-uniformity, a rotary drive shaft 82 rotated by a drive source 84 and supporting the magnetron 70 circumferentially scans the magnetron 70 about the chamber axis 76. However, as has been described with respect to the reactor of Fu et al., the resultant annular troughs in the target may produce significant radial non-uniformity in the sputtering.

Hong et al. significantly reduce the sputtering non-uniformity by the use of a planetary scanning mechanism 90 to cause the magnetron 70 to move along a planetary or other epicyclic path over the back of the target 34 with respect to the central axis 76. Their preferred planetary gear mechanism 90 for achieving planetary motion includes, as additionally and more completely illustrated in FIG. 5, a fixed gear 92 fixed to a housing 94 and a drive plate 96 fixed to the rotary shaft 82. In the reactor of Hong et al., the housing 94 is stationary. The drive plate 96 rotatably supports an idler gear 98 which engages the fixed gear 92. The drive plate 96 also rotatably supports a follower gear 100 engaged with the idler gear 98. A shaft 102 of the follower gear 100 is fixed also to the carrier 81 so that the magnetron 70 supported on the carrier 81 away from the follower shaft 102 rotates with the follower gear 100 as it rotates about the fixed gear 92 to execute the planetary motion. Counterweights 110, 112 are fixed to the non-operative ends of the drive plate 96 and the carrier 81 to reduce bending and shimmy on the rotary drive shaft 82 and the follower shaft 102. Particularly in copper sputtering which achieves a high ionization ratio $Cu^+/Cu^0$ of sputtered copper ions, the sputter reactor 30 of FIG. 4 advantageously includes a magnetic coil or magnet ring 114 annular about the central axis 76 to guide the copper ions to the wafer 42.

Because the DC power supply 54 delivers a significant amount of power to the target 34 and a high flux of energetic ions bombard the target 34 thereby heating the target 34, it is conventional to immerse the magnetron 70 as well as the planetary mechanism 90 in a cooling water bath 116 enclosed in a tank 118 sealed to the target 34 and the fixed drive-shaft housing 94. Unillustrated fluid lines connect the bath 116 with a chiller to recirculate chilled deionized water or other cooling fluid to the bath 118.

The planetary magnetron scanning, because of its convolute path across the target 34, greatly improves the uniformity of target erosion so that the target 34 is more uniformly eroded and results in a nearly planar sputtering surface even as the target is eroded. As a result, the target utilization is greatly improved. Nonetheless, as the target 34 erodes generally uniformly, the magnetic field at its sputtering face is changing and apparently on average decreasing. The change affects the sputtering rate, which as described above has been observed to decrease. The plots presented in FIG. 3 are speculative. Actual experimental data are presented in FIG. 6. Plot 120 presents the measured deposition rate for copper in the planetary magnetron chamber of FIG. 4 having an axially fixed magnetron and with 28 kW of DC target power and 600 W of RF bias power as a function of target usage in kilowatt-hours. Plot 121 presents the deposition rate for a small axially fixed magnetron executing simple rotary motion, as described by Fu et al., with 56 kW of DC target power. Although the fall off in the simple rotary chamber is not as great in the planetary chamber, it is still significant. It is pointed out, however, that it may be advantageous to more heavily sputter the outer regions of the target 34, particularly when the target/wafer spacing is relatively small in order to compensate for the geometric effect of greater deposition at the wafer center. Such intended non-uniformity can be achieved by adjusting the length of the rotation arms in a planetary chamber or by changing the shape or radial position of the magnetron in a simple rotary chamber. Even in this case, the deposition rate decreases with target usage.

A second set of non-uniformity problems is not immediately addressed by the planetary scanning mechanism. The small area of the magnetron 70 advantageously produces a high target power density and high plasma density and hence increases sputtering rate and increases the fraction of ionized sputter atoms which are drawn deep within high aspect-ratio holes to coat the sides and bottom of via holes. However, the magnetic field and hence the plasma density depend upon the distance between the target sputtering surface and the magnetron. As a result, as the target 34 is being sputtered, even if uniformly, the plasma density is changing and hence the sputtering rate and the ionization rate upon which the via sidewall coverage depends are changing. The effect is exacerbated for a small magnetron because the gradient of the magnet field is greater. As a result, the changing magnetic field and plasma density destabilizes the process causing variation in bottom and sidewall coverages across the lifetime of the target. It has generally been accepted that the high-performance sputtering is different at the end of the lifetime of the target than at the beginning. Plot 122 in FIG. 7 shows the measured target voltage and plot 123 in FIG. 8 shows the measured mean bias voltage with respect to target usage for the axially fixed planetary magnetron with the aforementioned values of target and bias power. There is a significant rise in the target voltage and the magnitude of the bias voltage with increased sputtering. However, the bias voltage is subject to fluctuations of about ±20V with the maximum magnitude greatly increasing to about 150V at maximum usage. The instability is readily apparent from the plot 122 of FIG. 7 for target voltage and the plot 123 of FIG. 8 for bias power. The change of sputtering rate can be compensated by increasing the sputtering duration, but this does not address the sidewall coverage. In any case, the increased sputtering period decreases throughput and introduces another variable into the queuing plan. The variation in plasma density because of reduced magnetic field can be partially compensated by increasing the target power. Such power compensation however involves an ad hoc relationship which needs to be determined for each set of conditions and also reduces the ability to maximize plasma densities and sputtering rates with limited power supplies.

Halsey et al. in U.S. Pat. No. 5,855,744 show an apparatus for deforming a linear magnetron as it scans across a rectangular target. In one embodiment, multiple actuators moving shafts along multiple respective axes deform the magnetron. Mizouchi et al. in U.S. Pat. No. 6,461,485 discloses a single vertical actuator for compensating for end effects in linear scanning.

Demaray et al. in U.S. Pat. No. 5,252,194 discloses a slider mechanism for vertically moving a large magnetron to adjust the magnetic field at the front of the target.

Schultheiss et al. in U.S. Pat. No. 4,927,513 discloses a magnetron lift mechanism to control magnetic properties of sputtered layers.

SUMMARY OF THE INVENTION

The invention includes the method and apparatus for compensating erosion of a plasma sputtering target by moving the magnetron away from the back of the target as the front of the target is eroded. The compensation provides a more constant magnetic field and plasma density at the surface of the target being sputtered and results in a more stable sputtering process.

The lift mechanism may include a lead screw mechanism including a lead screw and lead nut. The lead screw may be axially fixed to the magnetron and a lead nut threadably engaged with the lead screw. Rotation of the lead nut vertically moves the magnetron. The lead screw may be azimuthally fixed while the lead nut is axially fixed. The lead nut may be manually moved or moved under the control of a motor or other actuator coupled to the lead nut by a gear or a linear lead screw mechanism or linear actuator.

The amount of lift my be dictated by a predetermined recipe or by a measured cumulative power applied to the target. Alternatively, the target resistance or power characteristic or the physical erosion depth may be monitored to determine when additional lift is required.

The magnetron lift mechanism may also be used to control the magnetic field at the face of the sputtering target for control of the sputtering process other than simple compensation of target erosion.

DETAILED DESCRIPTION OF THE PREFERRED EMBODIMENTS

Figure 1:
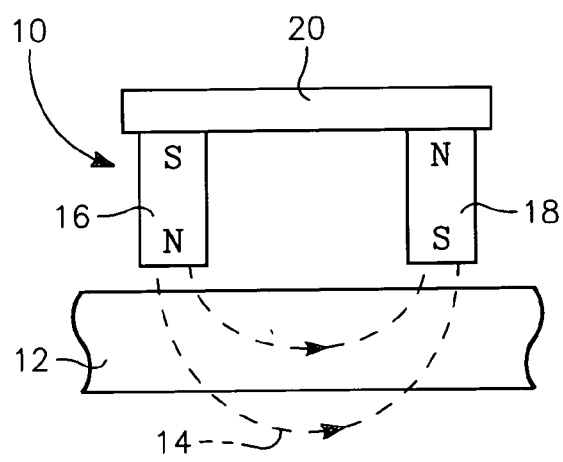
FIGS. 1 and 2 are cross-sectional views functionally illustrating the effect of magnetron sputtering as the target is being eroded.
Figure 2:
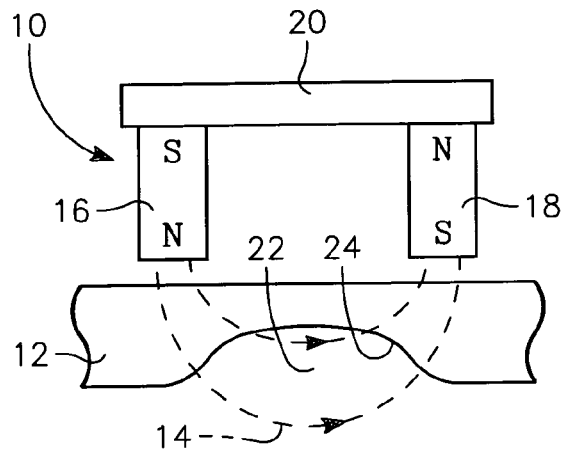
Figure 3:
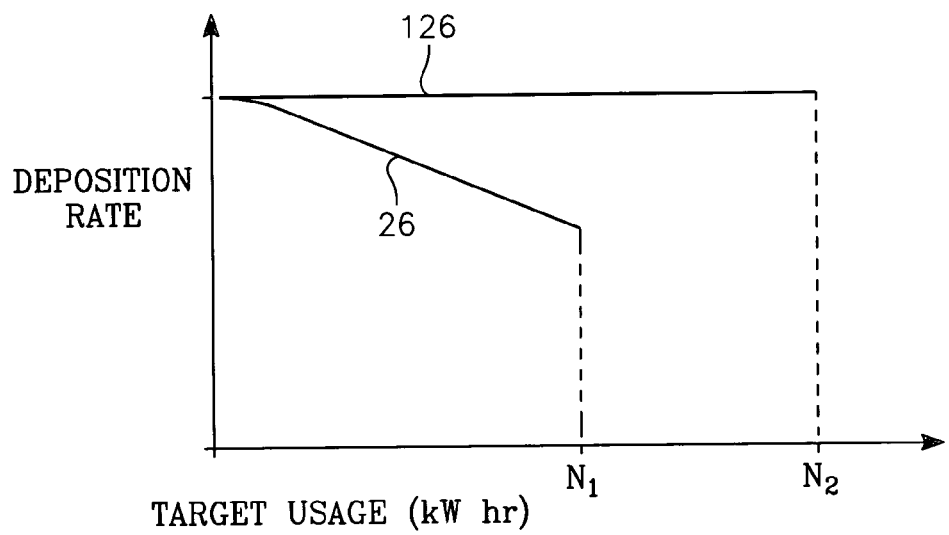
FIG. 3 is a graph illustrating the dependencies in the prior art and according to the invention of the sputtering deposition rate as a function of the target usage.
Figure 4:
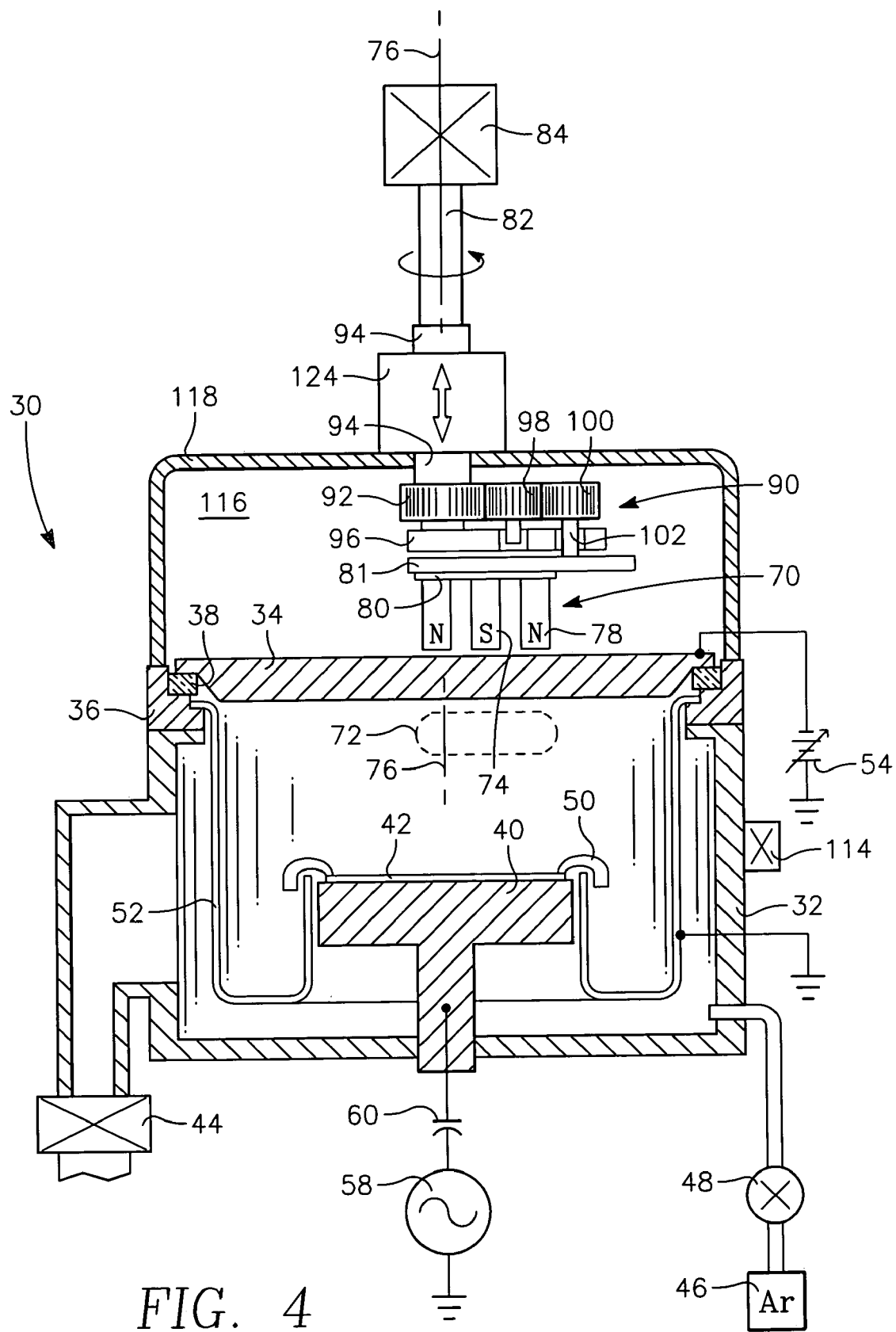
FIG. 4 is a schematic cross-sectional view of a plasma sputter reactor with a planetary magnetron.

The erosion of the front of the target in magnetron sputtering can be compensated by moving the magnetron away from the back of the target. As illustrated in FIG. 4, a lift mechanism 124 controllably raises the magnetron 70 with respect to the back of the target 34, preferably in an amount commensurate to the amount of the front surface of the target 34 that has been eroded since the target 34 was installed with a fresh planar front surface. The compensation should focus on the areas of the target 34 being more heavily eroded since they contribute a higher fraction of sputtered atoms. While the conventional design criterion minimizes the distance between the magnetron 70 and the back of the target 34 and maintains the separation at this initial spacing, one preferred criterion of the invention maintains an approximately constant spacing between the magnetron 70 and the front of the target 34 facing the wafer 42. The nearly constant spacing maintains a substantially constant magnetic field at the surface of the target 34 being sputtered. The nearly constant magnetic field removes one variable from the process conditions determining sputtering performance, not just sputtering rate but also ionization fraction among other effects. Thereby, sputtering time or target voltage do not need to be adjusted for target usage. Movement of the magnetron to maintain a substantially constant magnetic field at the front face of the target 34 stabilizes the sputtering process over the life of the target and enables a substantially constant deposition rate despite target usage, as schematically illustrated in plot 126 of FIG. 3. Also, the sidewall and bottom coverages may be maintained substantially constant over the life of the target. Furthermore, the lifetime of the target considerably increases to a value $N_2$ as the target is nearly uniformly eroded almost to its backing plate.

Although other implementations are possible, the lift mechanism 124 can be easily incorporated into the conventional design by allowing the housing 94 to be axially movable by the lift mechanism while still maintaining its fluid seal to the tank 118.

Figure 5:
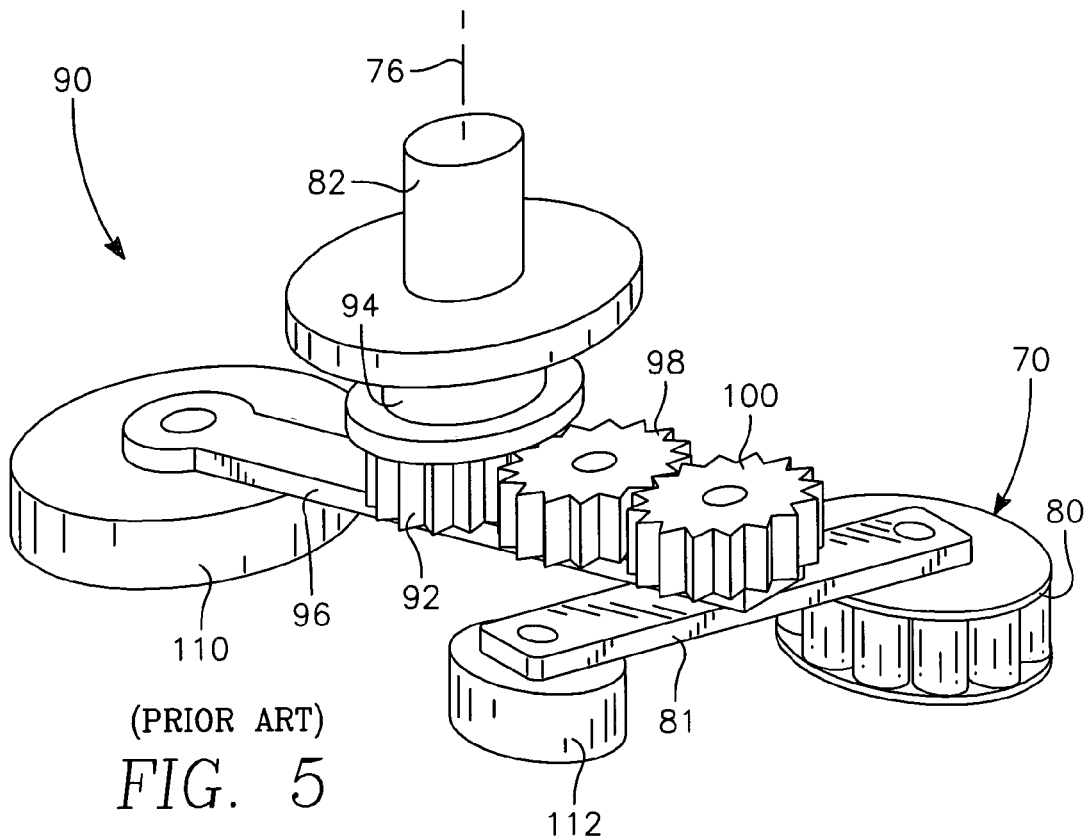
FIG. 5 is an isometric view of a planetary magnetron.

A first embodiment of the invention used to verify the effects of compensating the magnetron-to-target spacing uses a series of shims of varying thickness placed between the magnetron 70 of FIG. 5 and the carrier 81. As the target erodes, the previous shim is replaced by a thinner shim. As a result, the magnetron 70 is being moved away from the back of the target 34 along a single axis at the center of the magnetron 70 although that axis is moving as the magnetron 70 is moved along a planetary path. As a result, a nearly constant magnetic field can be maintained at the sputtering surface of the target 34 over the target life thereby stabilizing the sputtering process. The manual shimming process may be alternatively effected by shims placed between the otherwise stationary housing 94 and the roof of the tank 118.

Figure 9:
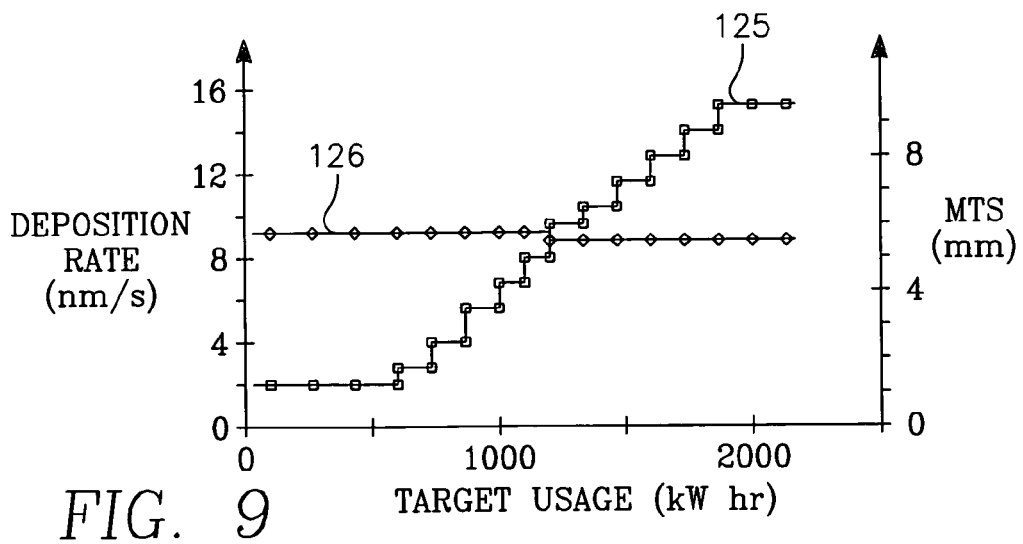
FIG. 9 is a graph illustrating as a function of target usage both a sequence of target spacings used in an experiment verifying the invention and the resultant sputtering deposition rate.
Figure 6:
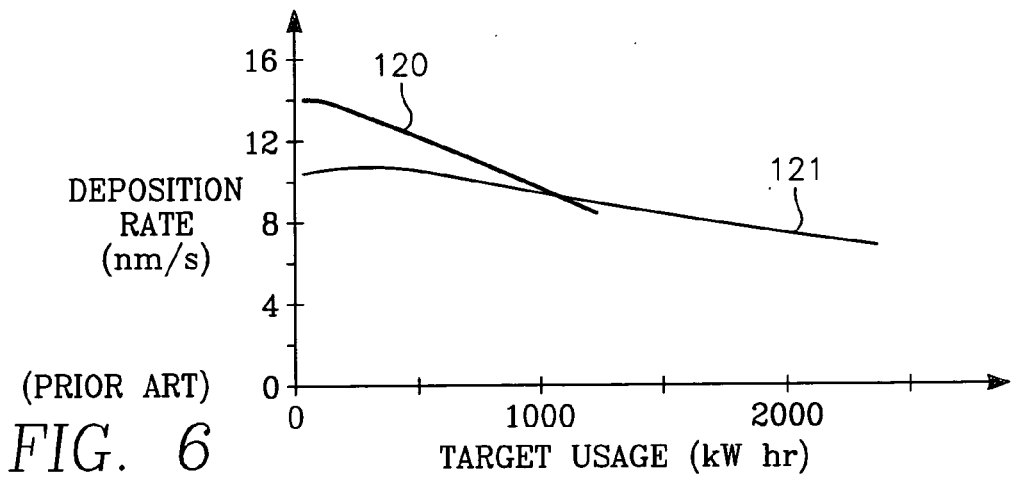
FIG. 6 is a graph illustrating the experimentally determined dependencies in the prior art of the sputtering deposition rate as a function of target usage.
Figure 7:
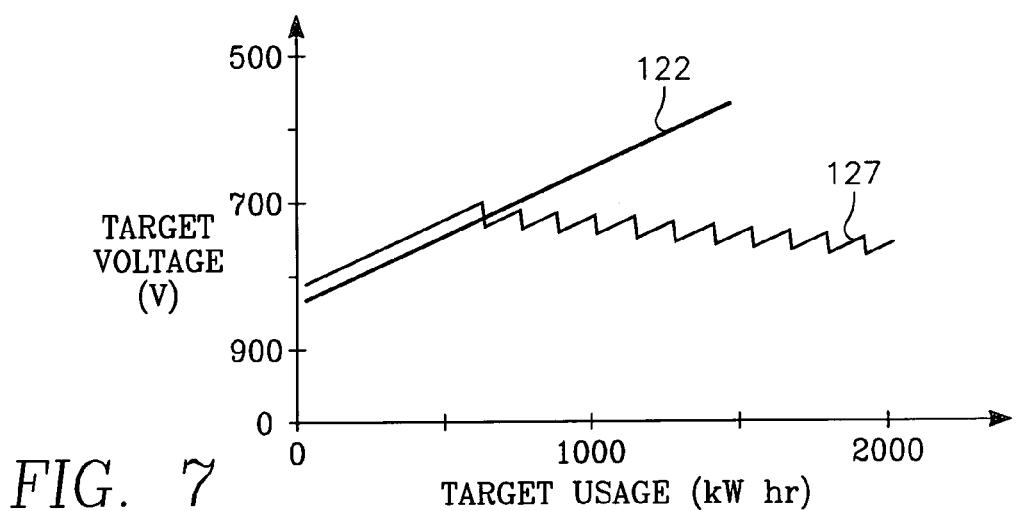
FIG. 7 is a graph illustrating the experimentally determined dependencies in the prior art and in the practice of the invention of target voltage as a function of target usage.
Figure 8:
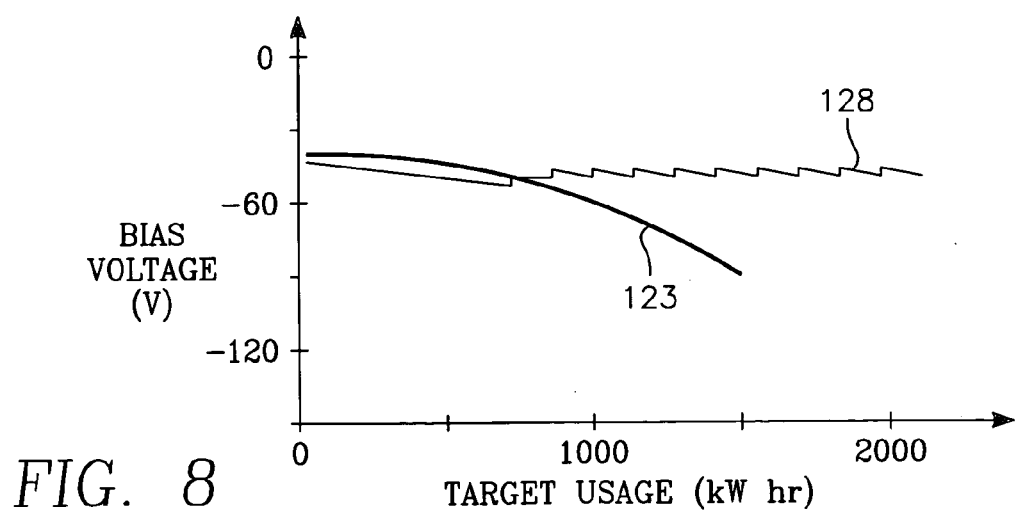
FIG. 8 is a graph illustrating the experimentally determined dependencies in the prior art and in the practice of the invention of bias voltage as a function of target usage.

Actual experimental data using a copper target and a planetary magnetron in the reactor of FIG. 4 are presented in FIG. 9. Plot 125 shows the magnet-to-target (MTS) spacing, specifically to the back of the target as the shim thickness was occasionally increased while plot 126 in shows the measured deposition rate. Even in these preliminary experiments, the deposition rate is maintained nearly constant. With the use of the invention, a copper target may be used to deposit thin copper seed layers on up to 20,000 wafers. Plot 121 in FIG. 6 also shows actual data for the moderated change of deposition rate as a function of target usage as the shims were being replaced. Plot 127 in FIG. 7 shows the dependence of measured target voltage as a function of target usage. Plot 128 in FIG. 8 shows the dependence of the mean of the measured bias voltage as a function of target usage. Further, although not illustrated, the deviations of the maximum and mean bias voltage from the mean do not significantly change with target usage.

These results could be improved particularly for target and bias power by more frequently moving the magnetron with a finer resolution. These results also show that target and bias voltages are sensitive indicators of the amount of erosion and hence the need for spacing compensation. These voltages are easy to monitor during production. Current is another sensitive measurement for electrical supplies generating constant power. Alternatively, if the power supplies are set to generate constant voltage or current, the complementary quantity or power may be measured. These electrical measurements typically amount to monitoring the resistance of the plasma under some set electrical condition. Therefore, the compensation can be dynamically controlled by measuring one or both of these voltages (or other quantities) during production and comparing them to baseline values. When the deviation exceeds a threshold, the compensation may be performed to bring the measured value closer to the baseline value. It is also possible to optically or otherwise measure the physical depth of erosion of the target and use the depth measurement to initiate the compensation. Nonetheless, it has proven satisfactory to keep track of cumulative target power and move the magnetron at values experimentally determined for a given sputter recipe.

Although the first embodiment relying on shims is effective, it clearly presents operational difficulties as the sputter reactor needs to be shut down and the magnetron removed from the water bath to allow manual replacement of its shims. It is greatly desired to perform the spacing compensation from outside the water bath and preferably under computerized electrical control.

Figure 10:
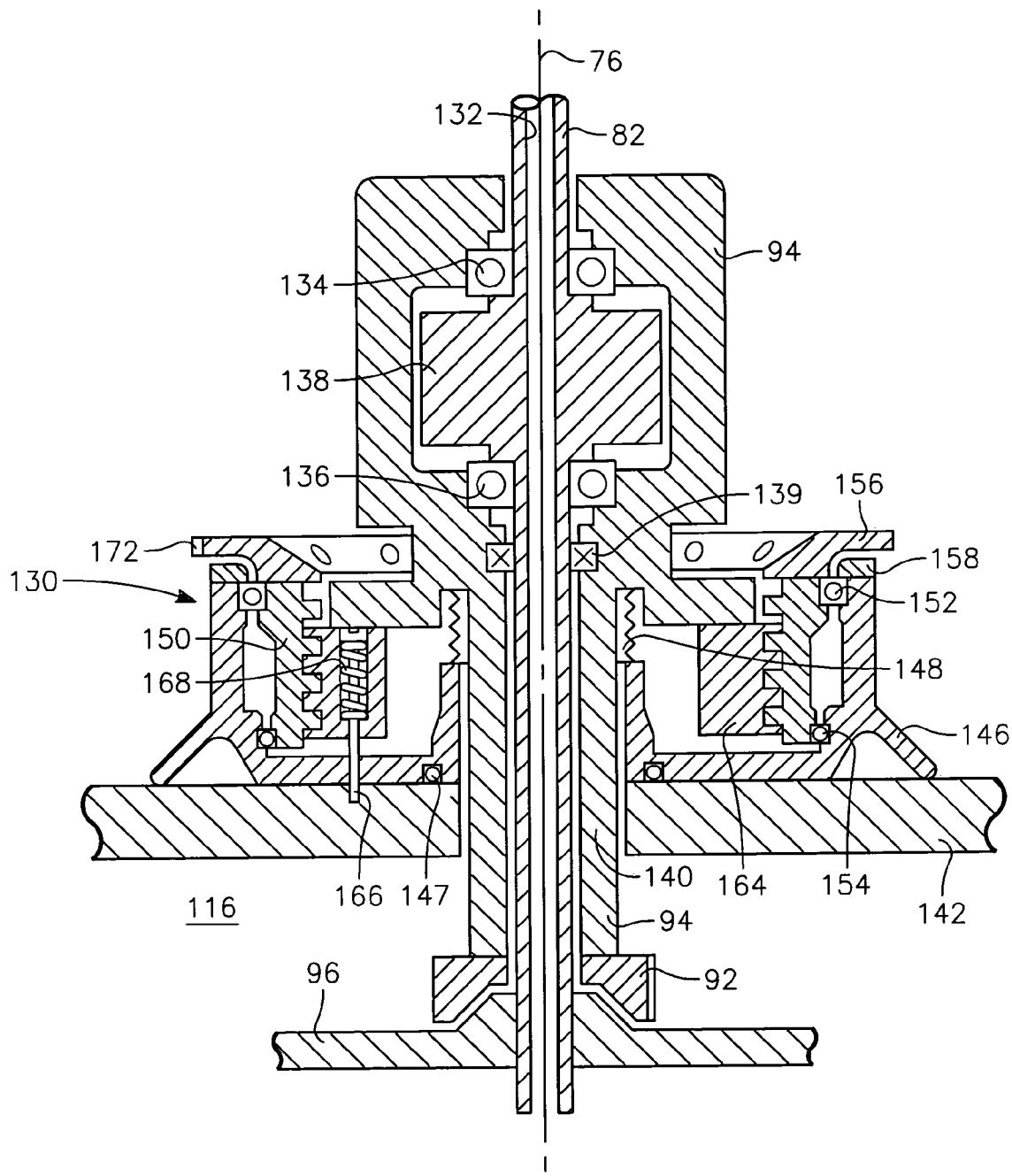
FIG. 10 is a cross-sectional view of a lead screw lift mechanism for raising the magnetron.

One set of embodiments is based on converting the stationary housing 94 to a vertically movable but in large part azimuthally fixed housing 94 driven by a lead screw mechanism 130, as illustrated in the cross-sectional view of FIG. 10. The rotary drive shaft 82 includes a central bore 132 for flowing chilled cooling water to the center of the tank 118 of FIG. 4 near the back of the target 34. The cooling water flows out of the water bath through an unillustrated outlet in a roof 142 or other wall of the tank 118. The top of the drive shaft 82 is coupled by yet further unillustrated belts or other means to the motor 84. The drive plate 96 of the planetary mechanism is fixed to the bottom of the drive shaft 82 and rotates with it. Two ring bearings 134, 136 rotatably support a boss 138 of the drive shaft 82 within the housing 94. An annular dynamic seal 139 the seals the fluid within the bath 116 from the bearings 134, 136 and the exterior.

A tail 140 of the housing 94 axially passes through an aperture in the tank roof 142 but is azimuthally fixed by other means. The fixed gear 92 of the planetary mechanism is fixed to the end of the housing tail 140. As a result, when the housing 94 is vertically moved, the fixed gear 92, the drive plate 96, and the rest of the planetary mechanism 90 and magnetron 70 are also vertically moved along the central axis 76.

A support collar 146 is fixed to the tank roof 142 and sealed to it with an O-ring placed in an O-ring groove 147. An annular bellows 148 surrounding the upper portion of the housing tail 140 is sealed on opposed ends to the housing 94 and to the inner portion of the support collar 146 to slidably seal the fluid in the bath 116 from the exterior as well as from most of the mechanical parts of the lift mechanism 130 while allowing axial movement between the housing 94 and drive shaft 82 on one hand and the tank roof 142 on the other. The bellows 148 should accommodate a movement of about ¾" (2 cm) corresponding to the usable thickness of the target 34. Other types of slidable fluid seals are possible. The fixed collar 146 rotatably supports an internally threaded lead nut 150 through two ring bearings 152, 154. An inner retainer ring 156 fixed to the lead nut 150 and an outer retainer ring 158 fixed to the collar 146 trap the upper bearing 152 against the lead nut 150 and the collar 146. Another similar retainer ring configuration beneath the lead nut 150 traps the lower bearing 154. The lead nut 150 can thus rotate about the central axis 76 but is axially fixed to the tank top 142.

The external threads of a azimuthally fixed but vertically movable lead screw 164 engage the internal threads of the lead nut 150 such that the lead nut 150 threadably engages the lead screw 164. The lead screw 164 supports the housing 94 on its upper surface. The housing 94 may be fixed to the lead screw 164 or guide pins may couple them to prevent relative rotational movement. A plurality of screws 166 hold the lead screw 164 to the tank top 142 through compression springs 168. As a result, the lead screw 164 is rotationally fixed as it engages the rotatable lead nut 150 but the compression springs 168 accommodate limited vertical motion of the lead screw 164. The axial fixing of the lead nut 150 to the tank top 142 provides a wide mechanical base for the heavy rotating magnetron, thereby reducing shimmy and allowing the reduction of the clearance between the magnetron 70 and the back of the target 34.

In operation, if the lead nut 150 is rotated clockwise, the azimuthally fixed lead screw 164 rises and lifts the housing 94 and the attached rotary shaft 82 and magnetron 70 away from the target 34. Counter-clockwise rotation of the lead nut 150 produces the opposite axial movement of lowering the magnetron 70 toward the target 34. The lift drive mechanism for rotating the lead nut 150 is easily formed outside of the cooling bath 116. Two types of lift drive mechanisms will be described.

Figure 11:
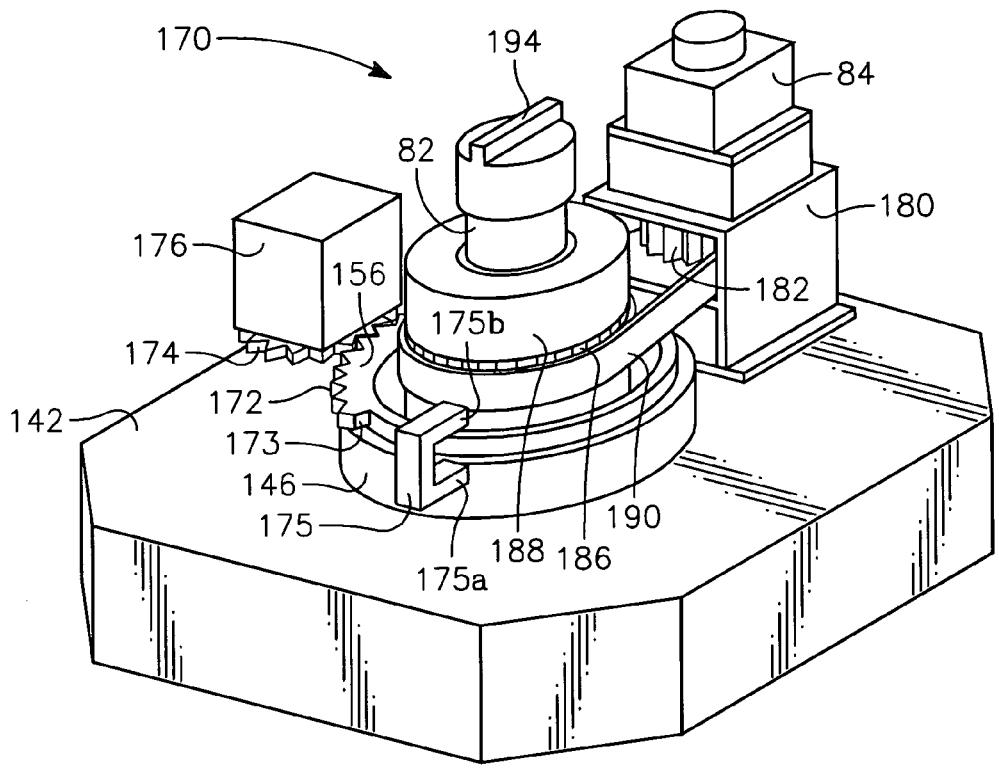
FIG. 11 is an orthographic view of the exterior portions of the lead screw lift mechanism of FIG. 10 and a spur gear mechanism for driving the spacing between target and magnetron.

A first embodiment of a rotational lift drive includes a spur gear drive 170 illustrated in the orthographic view of FIG. 11. The outer rim of the inner retainer ring 156 is partially formed with a toothed gear 172 in a gear ledge 173 extending from only part of the inner retainer ring 156. The toothed gear 172 engages with a lift drive gear 174 controllably driven by a lift motor 176, which may be mounted on the tank roof 142 with a vertically oriented drive shaft to which the toothed gear 172 is fixed. The lift motor 176 is preferably a stepper motor rotating a fixed angle for each motor pulse with a separate control signal controlling the direction of rotation. Thereby, the lead nut 150 of FIG. 10 is controllably rotated to raise or lower the lead screw 164 and hence the housing 94 and attached drive shaft 82 and magnetron 70.

An optical position sensor 175 includes two arms 175a, 175b spaced to accommodate the gear ledge 173 as it rotates in lifting the magnetron. One arm 175a contains an optical emitter, such as an light emitting diode, while the other arm 175b contains a light detector, such as a photodiode. The position sensor 175 is used to calibrate the rotation of the gear 172 using the gear ledge 173 as a flag. The lift motor 176 rotates the gear 172 toward the position sensor 175 until the gear ledge 173 enters between the arms 175a, 175b of the position sensor 175 and blocks the emitted light from the optical detector. The controller notes that position as a home position. The stepper motor 176 is then stepped in the opposite direction by a controlled number of pulses to a desired rotation location of the gear 172 and hence vertical position of the magnetron. Other position sensors may be used.

The drive shaft motor 84 may be vertically mounted on the tank roof 142 through a motor mount 180. The drive shaft motor 84 drives a motor drive gear 182 through optional unillustrated gearing to reduce the rotation rate. A shaft drive gear 186 is formed in a capstan 188 fixed to the drive shaft 82. A ribbed belt 190 is wrapped over both the motor drive gear 182 and the shaft drive gear 186 so that the motor 84 rotates the drive shaft 82 in executing the planetary motion of the magnetron 70. Because the drive shaft 82 and the attached shaft drive gear 186 are raised and lowered in operation relative to the motor mount 180 and attached motor drive gear 182, the teeth of at least the shaft drive gear 186 must be wide enough to accommodate the slip or axial movement of the belt 190 relative to teeth of that gear 186 and the motor drive gear 182 may be formed with two rims to limit the axial movement of the belt 190 on that gear 182. A rotary fluid coupling 194 is mounted on the top of the drive shaft 82 to allow cooling water lines to be connected to the central bore 132 of the rotating drive shaft 82.

Figure 12:
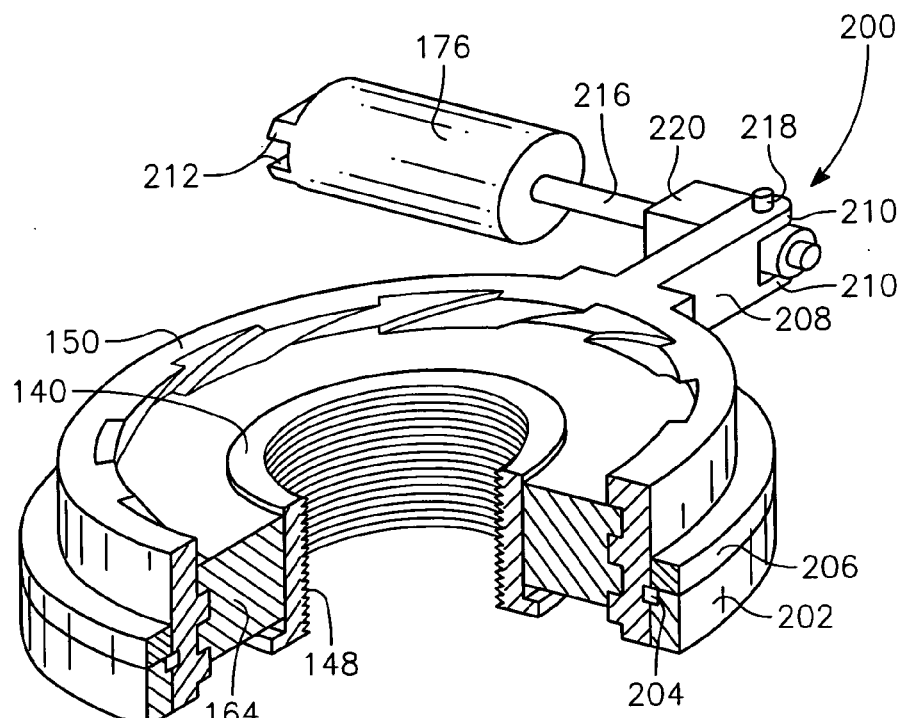
FIG. 12 is an orthographic view of a first embodiment of a lead screw mechanism for driving the spacing compensation.

A second embodiment of a rotational lift drive includes a lead screw mechanism 200 illustrated in the orthographic, partially sectioned view of FIG. 12. A support collar 202 is fixed to the tank roof 142 and rotatably supports the lead nut 150 through a ring bearing 204 trapped by an upper retainer ring 206. A lead nut lever 208 extends radially outwardly from the lead nut 150 and has two parallel arms 210 formed at its end. A pivot connection including two arms 212 at the back of the lift motor 176, an unillustrated pivot pin through them, and a mount for the pin, pivotally mounts the lift motor 176 to the tank roof 142 in a horizontal orientation. The horizontally oriented lift motor 176 rotates a shaft 216 having a lead screw formed on its distal end. A nut box 220 threadably captures the lead screw of the drive shaft 216 and is pivotally supported by a pin 218 fixed to the arms 210 of the lead nut lever 208. Thereby, rotation of the lift motor 176 rotates the lead nut 150 to raise or lower along the central axis 72 the lead screw 164 and hence the housing tail 140 and attached drive shaft 82 and magnetron 70.

The second embodiment of FIG. 12 can be easily modified to replace the lift motor 176 with a hydraulic or pneumatic linear actuator driving a shaft pivotally coupled at its end to the arms 210 of the lead nut lever 208. Yet further, the second embodiment could be manually controlled by the operator manually rotating the lead nut lever 208. Other combinations of gears, levers, and actuators or motors can be used to implement the lead nut lift mechanism.

The lead nut lift mechanism offers several advantages. It is concentric about the lift axis and the support shaft for the magnetron. The magnetron is supported on an azimuthally fixed lead screw threaded into a larger lead nut that is axially fixed to a yet larger structure. Hence, the lead nut lift mechanism offers low vibration and flexing of the relatively heavy rotating magnetron. The design is mechanically simple, thereby increasing reliability and reducing cost.

Figure 13:
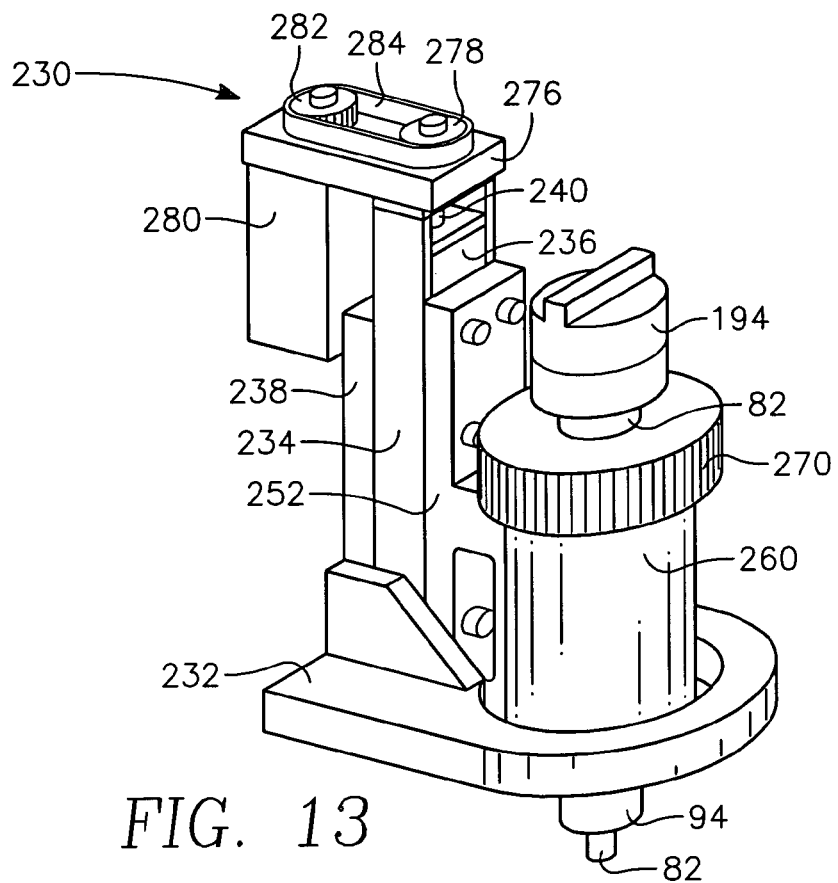
FIG. 13 is an orthographic view of a dual slider mechanism for driving the spacing compensation to be used in the lead screw mechanism of FIG. 10.
Figure 14:
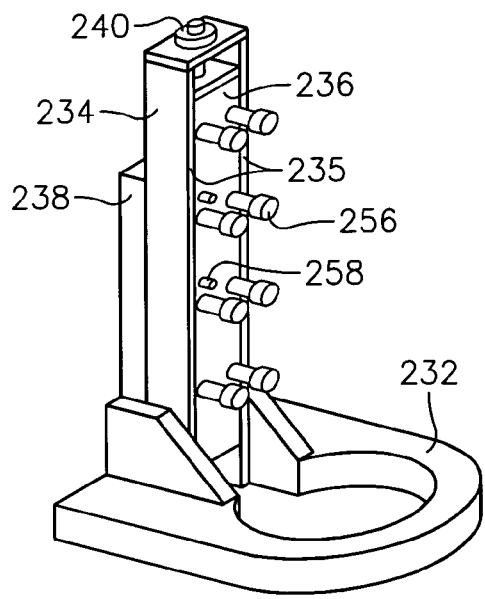
FIG. 14 is an orthographic view of a collar, slider and its case to be used in the slider mechanism of FIG. 13.

A second type of lift mechanism is a double slider mechanism 230 illustrated orthographically in FIG. 13. It includes an elongated collar 232, also illustrated orthographically in FIG. 14, adapted to be fixed and sealed to the tank roof 142. A vertically oriented slider case 234 fixed to the collar 232 includes two vertically extending and horizontally stacked tracks, one of which is formed on one side by rails 235. The two tracks respectively trap two sliders 236, which are fixed together and can together vertically move along the rails 235. Only the exterior slider 236 is illustrated. Two sliders fixed to each other provide greater stiffness in supporting the relatively heavy load. A vertically extending back 238 is fixed to the collar 232 to provide a rigid mount for the slider case 234 and other parts. A vertically oriented drive shaft 240 is rotatably supported in the top end of the slider case 234. The lower end of the drive shaft 240 is threaded as a lead screw and engages corresponding threads formed in an unillustrated lead box axially supporting both sliders 236. As a result, when the drive shaft 240 rotates, the sliders 236 move up or down within the slider case 234.

Figure 15:
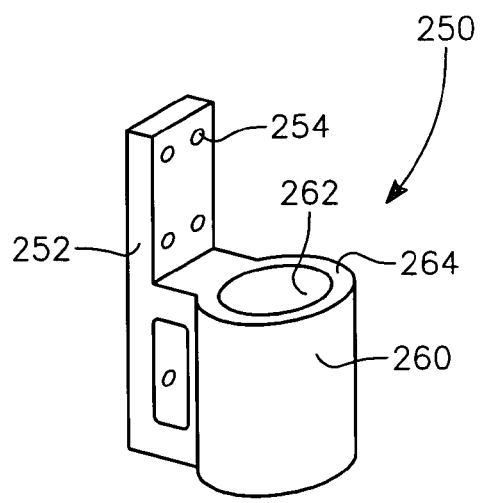
FIG. 15 is an orthographic view of a bracket used with the slider mechanism of FIG. 13.

A bracket 250 illustrated orthographically in FIG. 15 has a base 252 sized to fit onto the exterior slider 234. A plurality of through holes 254 drilled through the bracket base 252 pass screws 256 threaded into the exterior slider 234 to snugly hold the bracket base 252. Locating pins 258 may be inserted into the exterior slider 234 to engage corresponding holes formed in the bottom of the bracket base 252. The bracket 250 further includes a tubular collar 260 having an aperture 262 sized to closely hold the housing 94 of FIG. 10, with suitable modifications of that housing 94, and an upper axial end 264 to support the housing 94. The housing 94 may be fixed to the tubular collar 260 or engage it through pins so that the housing 94 does not rotate.

Returning to FIG. 13, a shaft gear 270 is fixed to the magnetron drive shaft 82 of FIG. 10, which is rotatable within but vertically fixed in the housing 94. The housing 94 itself is not rotatable but can move vertically with respect to the collar 232 and the tank roof 142. The vertically movable housing 94 may be sealed to the tank roof 142 by an assembly including the bellows 148 of FIG. 10 to be axially movable with respect to the tank roof 142 over a limited throw. The shaft gear 270 is similar to the shaft gear 186 of FIG. 11 and may be driven by the belt 190 driven by the vertically oriented motor 84. The belt 190 as applied to FIG. 13 should be able to vertically slide along the teeth of the shaft gear 270.

A slider drive mechanism includes a plate 276 fixed to end of the slider case 234 which passes the end of the slider shaft 240 to be fixed to a slider gear 278. The plate 276 also supports below a vertically oriented slider motor 280 having a drive shaft fixed to a motor gear 282. A ribbed belt 284 is wrapped around the slider and motor gears 278, 282 so that the slider motor 280 can move the slider 234 up and down within the slider case 250 to thereby vertically move the housing 94 and attached magnetron 70 relative to the tank roof 142 and the back of the target 34.

Figure 16:
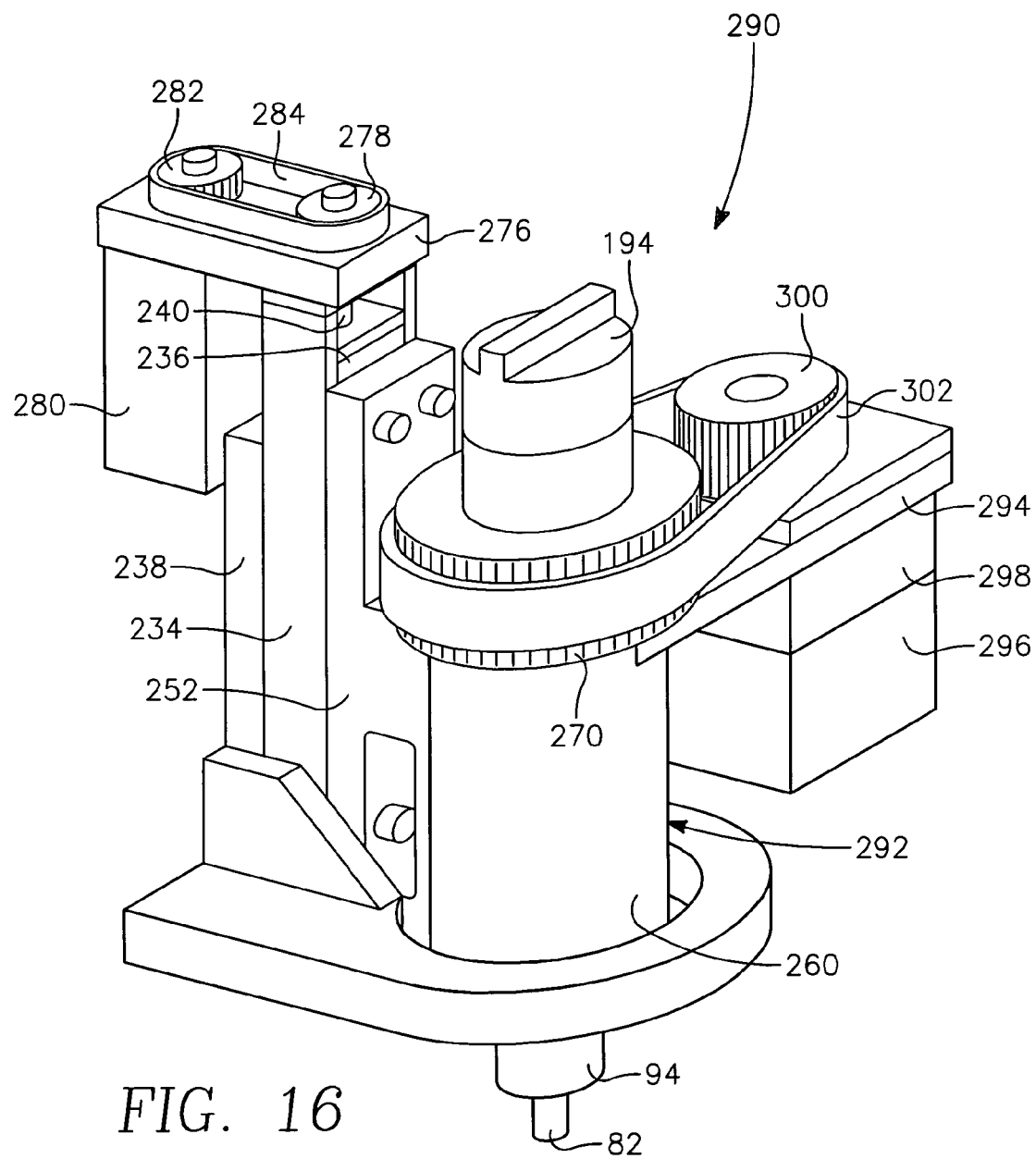
FIG. 16 is an orthographic view of the slider mechanism of FIG. 13 additionally including a magnetron rotation motor.

A modified double slider mechanism 290 illustrated orthographically in FIG. 16 includes a modified bracket 292 having a shelf 294 extending outward from the top of the tubular collar 260. A shaft drive motor 296 and gear box 298 are supported on the bottom of the shelf 294 to drive a motor gear 300. A ribbed belt 302 engages both the motor gear 300 and the shaft gear 270 to thereby rotate the magnetron shaft 82 and cause the attached magnetron 70 to execute planetary motion. Because the motor 296 and motor gear 300 are axially fixed to the housing 94 and hence moves with the magnetron shaft 82, the belt 270 does not need to slip along the teeth of the gears 270, 300.

The described compensation mechanisms may be used in a number of ways for compensating target erosion. It is possible to perform the lifting and compensating during the plasma excitation and sputter deposition, but it is preferable instead to perform it after one wafer is processed and before the next one is processed. Even though motor controlled, the mechanisms may be essentially manually controlled by on occasion instructing the lift motor to move a set amount corresponding to a desired lift of the magnetron. However, the lift compensation algorithm is advantageously incorporated into the recipe for which a machine is being used and a computerized controller performs the compensation as well as controls the other chamber elements according to the recipe. In view of the limited axial throw of about 2 cm and the large number of wafers which may be deposited with a single target over many weeks of even continuous processing, it is reasonable to compensate the spacing on only an occasional basis, for example, once an hour or once a day or more specifically after a large number of wafers have been processed.

In a control procedure emphasizing the optimized process in which the reactor is being used, the amount of displacement may be determined empirically for a given combination of target, magnetron, initial target/magnetron spacing, and general operating conditions developed for a step in the fabrication of a chip design. A convenient unit of target usage is total kilowatt-hours of use since the target was fresh so that the process recipe keeps a running total of kilo-watt hours and adjusts the spacing as a function of the total kilowatt-hours according to a compensation algorithm incorporated into the process recipe and set during development of the recipe. The compensation may be controlled once a set period for this unit has passed. For a given process, wafer count is nearly as good a usage unit.

A dynamic control algorithm may also be effective. As is evident from the plots 122, 127 of FIG. 7, the measured target voltage can be tracked and correlated with deviations from a predetermined value set by the recipe. when the measured voltage deviates by a set voltage increment, the magnetron may be moved upwardly by a set spacing increment experimentally determined beforehand to largely compensate the voltage increment. In fact, the empirical algorithm may be obtained in corresponding fashion during development of the process in which the development engineer tracks changes in the target voltage as a function of target usage and experimentally determines what spacing compensation is necessary to bring the target voltage back to a set value.

It is also possible to directly measure the position of the sputtering surface of the target by optical or other means or to measure the thickness of the target by separate electrical means, both approaches providing a measurement of target erosion.

It is desirable that the compensation be directly measurable by a feedback measurement, for example, the angular position of the set nut or of the linear position of the slider or an angular displacement of one of the rotary parts, all measured from a known position. For example, the position sensor 175 of FIG. 11 acts as a limit indicator useful for resetting after a power outage or computer glitch.

It is noted that the baseline magnetron-to-target spacing may vary from one recipe to another and the described lift mechanisms may be used to initially obtain the baseline spacing for a fresh target as well as to maintain it during extended target usage.

Figure 17:
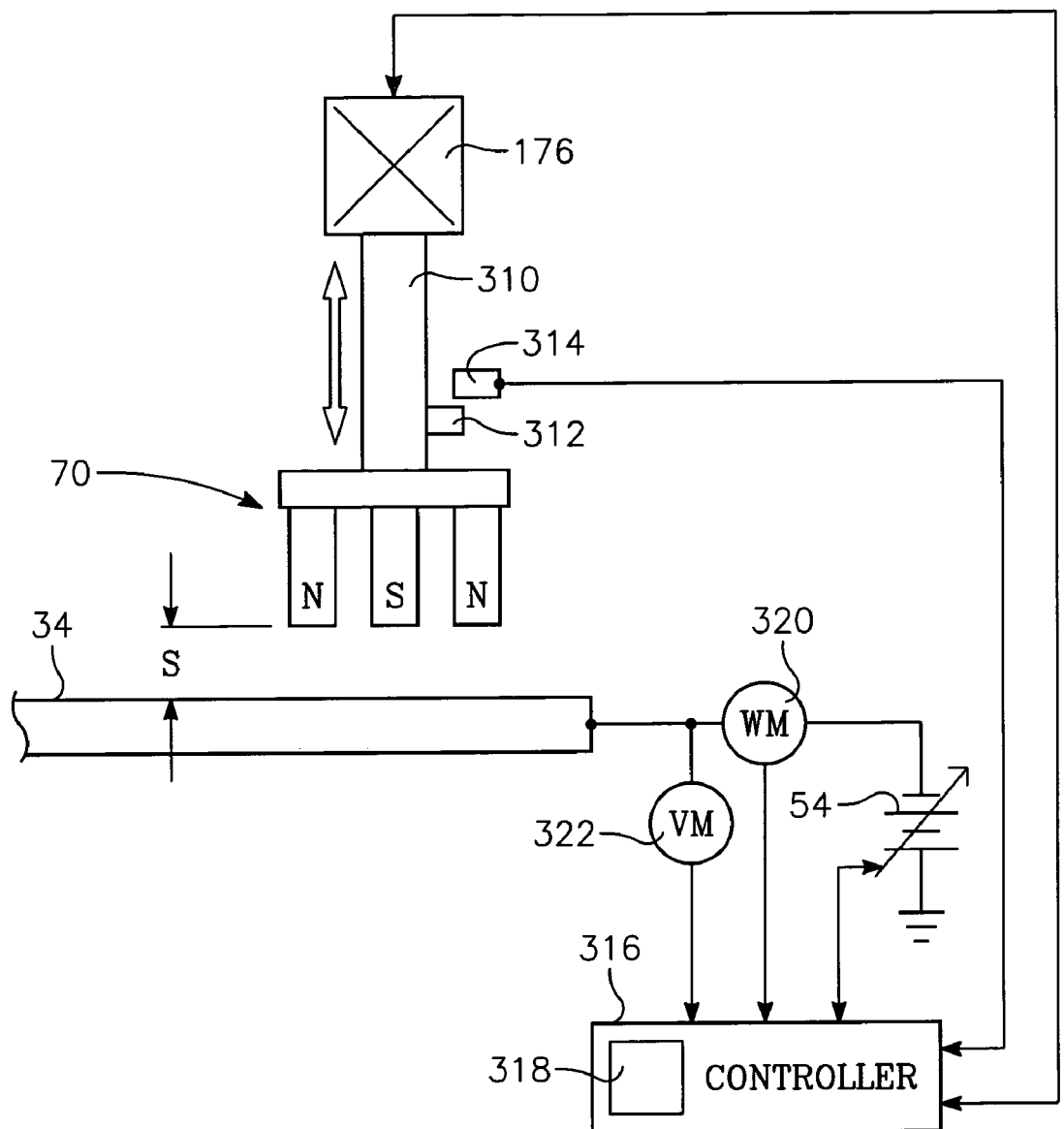
FIG. 17 is a schematic representation of a computerized lift control system.

FIG. 17 schematically illustrates an example of a control system for adjusting the spacing S between the front face of the magnetron 70 and the back surface of the target 34 as well as controlling other parts of the sputter reactor. The lift motor 176 is preferably implemented in a stepper motor that is connected through a schematically illustrated mechanical drive 310 (for example that of FIGS. 10 and 11) which can selectively raise or lower the magnetron 70. A flag 312 attached to the mechanical drive 310, and a position sensor 314 detects the position of the flag 312, for example, at the extreme of the travel of the mechanical drive 310 in which the magnetron 70 is farthest from the target 34.

A computerized controller 316 is conventionally used to control the sputtering operation according to a process recipe stored within the controller 316 on a recordable medium 318, such as a recordable disk. The controller 316 conventionally controls the target power supply 54 as well as other conventional reactor elements 44, 48, 58, 84, and 114. Additionally according to the invention, the controller 316 controls the stepper motor 176 with a controlled series of pulses and a directional signal to drive the magnetron 70 a controlled distance in either direction. The controller 316 stores the current position of the magnetron 70 and, if additional movement is desired, can incrementally move the magnetron 70. However, on startup or after some unforeseen interrupt, the controller 316 raises the magnetron 70 away from the target 34 until the position sensor 314 detects the flag 312. The setting of the stepper motor 176 at this flagged position determines a home position. Thereafter, the controller 316 lowers the magnetron 70 to a desired position or spacing S from the target 34. This limit detection may be implemented by the position sensor 175 of FIG. 11.

The recipe stored within the controller 316 may contain the desired compensation rate, for example, as a function of kilowatt hours of power applied to the target 34 from the power supply 54 or alternatively as a compensation for variation in target voltage. The controller 316 can monitor the applied power through a watt meter 320 connected between the power supply 54 and the target. However, the power supply 54 is often designed to deliver a selectable constant amount of power. In this case, the total power consumption can be monitored by software within the controller 316 with no direct power measurement. The controller 316 may also monitor the target voltage with a voltmeter 322 connected to the power supply line to the target 34. As mentioned previously, target voltage is a sensitive indicator of the need to compensate the spacing between magnetron and target.

Figure 18:
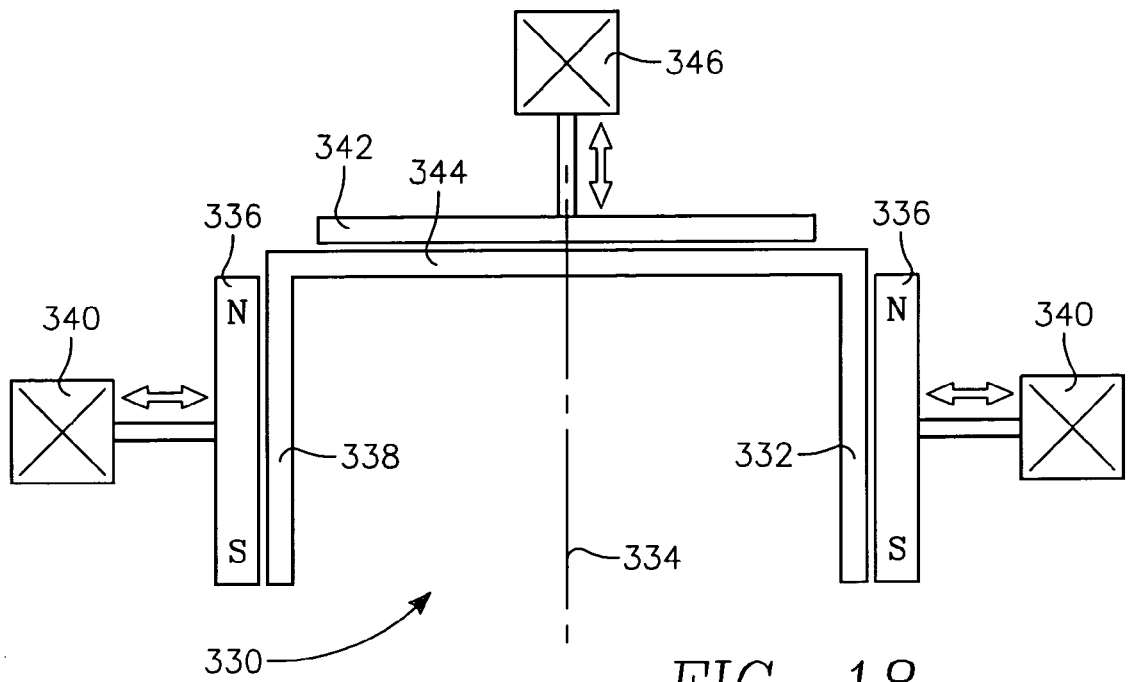
FIGS. 18 and 19 are schematic cross-sectional view of two hollow cathode magnetrons incorporated the invention.

The spacing compensation may be advantageously applied to the roof magnetron used with a target having an annular vault formed in its surface, as has been described by Gopalraja et al. in U.S. Pat. No. 6,451,177, incorporated herein by reference in its entirety. The invention can also be applied to a sputter reactor having a hollow cathode magnetron 330 schematically illustrated in FIG. 18, such as disclosed by Lai et al. in U.S. Pat. No. 6,193,854, incorporated herein by reference in its entirety. The hollow cathode magnetron 330 includes a target 332 formed with a single right circular cylindrical vault extending about a central axis 334 and facing an unillustrated pedestal supporting the wafer. Unillustrated biasing means applied to the target 332 relative to an anode excites the sputtering working gas into a plasma to sputter the portions of the target 332 inside the vault to thereby coat a layer onto the wafer of the material of the target 332.

Permanent magnets 336, usually axially aligned, are placed around the exterior of a circumferential sidewall 338 of the target 332 to serve several functions including intensifying the plasma adjacent the sidewall 338. However, in some implementations, the magnets are horizontally aligned to create a bucking field within the vault adjacent the sidewall 338. According to the invention, motors or other types of actuators 340 selectively move the magnets 336 radially with respect to the central axis 334 to compensate for sputtering erosion of the target sidewalls 338. The hollow cathode magnetron 330 may additionally include a roof magnetron 342 positioned in back of a disk-shaped roof 342 of the target 332. The roof magnetron 342 may be stationary or be rotated about the central axis 334. According to the invention, a motor or other actuator 346 may be used to axially move the roof magnetron 342 along the central axis 334 to compensate for erosion of the target roof 344. However, as has been previously discussed, the various magnet movements may be used alternatively to tune the sputtering process to an initial state as well as to maintain it there.

Figure 19:
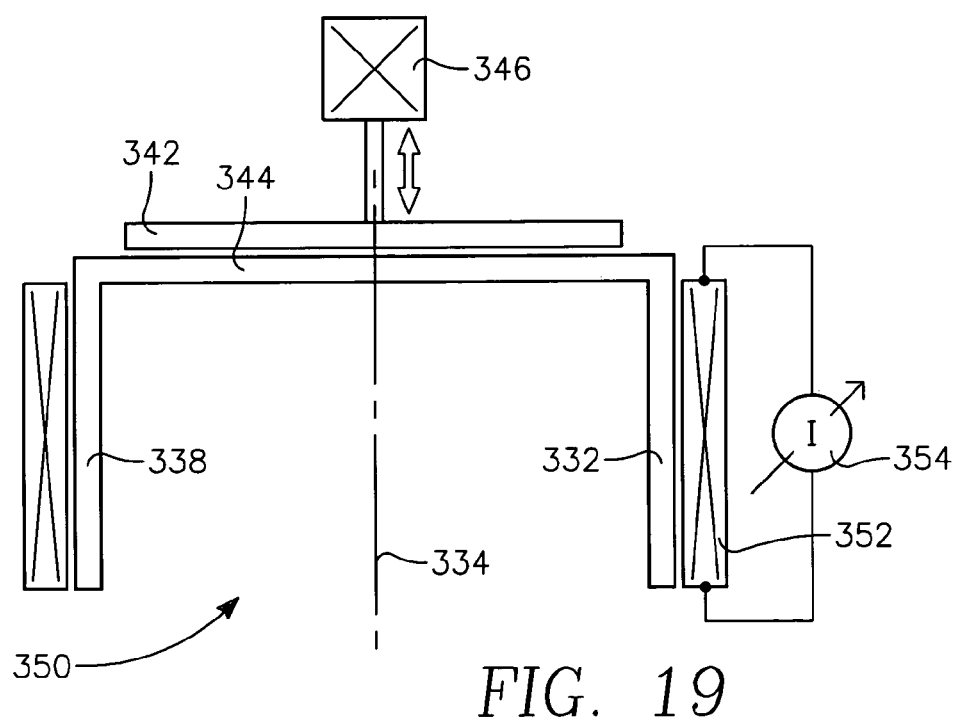

An alternative hollow cathode magnetron 350 schematically illustrated in FIG. 19 uses a sidewall coil 352 wrapped around the target sidewall 338 to produce an axial magnetic field inside the target vault. According to the invention, an adjustable power supply 354 supplying the coil current is adjusted, for among other reasons, to compensate for target erosion such that a more constant magnetic field is produced adjacent the interior surface of the eroding target.

The compensation mechanism is not limited to those which have been described. For example, especially in the case that the magnetron executes, only simple rotary motion, the rotary shaft supporting the magnetron can be directly lifted if an additional dynamic or slidable seal allows leak-free axial movement of the rotary shaft. Other types of lift mechanisms and lift drives may be used in achieving the control or compensation of the target/magnetron spacing. However, the lead-screw lift mechanism 130 of FIG. 10 has effectively been used for compensating an SIP magnetron of the Fu patent which executes simple rotary motion.

However, the lead-screw lift mechanism 130 of FIG. 10 has effectively been used for compensating an SIP magnetron of the Fu patent which executes simple rotary motion.

Although the above described lift mechanisms have been described for raising a magnetron away from the target backside, they may be used as well to lower the magnetron. Also, the apparatus may be used for purposes other than compensating for target erosion.

Although the invention has been developed for copper sputtering, it may be used for sputtering other materials dependent on the target material and whether a reactive gas is admitted to the chamber. Such materials include nearly all metals and metal alloys and their reactive compounds used in sputter deposition, including but not limited to Cu, Ta, Al, Ti, W, Co, Ni, NiV, TiN, WN, TaN, Al—Cu alloys, Cu—Al, Cu—Mg, etc.

The invention may be also applied to other magnetrons such as the more conventional large kidney-shaped magnetrons and to other magnetrons not intended to ionize the sputtered atoms. Nested magnetrons are not required. Long-throw sputter reactors can benefit from the invention. Inductive RF power may be coupled into the magnetron sputter reactor to increase the source power. Although the invention is particularly useful with scanned magnetrons, it may also be applied to stationary magnetrons. It may also be applied to magnets used more for confining the plasma and guiding ions rather than strictly for increasing the plasma density.

Accordingly, the invention greatly stabilizes a sputtering process over the lifetime of the target with relatively minor additions to the sputter apparatus.

The above described embodiments do not encompass all possible implementations and uses of the invention. The coverage of the invention should be determined primarily by the specific language of the claims.

The invention claimed is:

1. In a magnetron sputter reactor including a chamber sealable to a sputtering target, a support within said chamber for holding a substrate to be processed, a magnet assembly placeable on a backside of said target opposite said support, a rotary drive shaft supporting and rotating said magnet assembly, a lift mechanism affixed to a support member of said magnet assembly and capable of varying a distance of said magnet assembly from said backside of said target, said lift mechanism comprising:

a rotating lead nut and axially fixed with respect to said chamber; and a rotationally fixed lead screw engaged with said lead nut and axially fixed to said support member of said magnet assembly, wherein said rotary drive shaft is rotatably supported on said lead screw and extends axially through an interior of the lead screw and wherein said lead nut is threadably engaged with said lead screw to allow the lead nut to rotate about the rotationally fixed lead screw.

2. The lift mechanism of claim 1, wherein said lift mechanism varies said distance by movement of said rotary drive shaft along a single axis.

3. The lift mechanism of claim 1, including an actuator nflating said lead nut relative to said lead screw.

4. The lift mechanism of claim 3, wherein said actuator is a motor.

5. The lift mechanism of claim 4, wherein said motor rotates a motor gear having a toothed outer exterior surface engaged with a geared toothed outer exterior surface formed in said lead nut to thereby axially move the lead screw.

6. The lift mechanism of claim 3, wherein said actuator drives an arm connected to said lead nut.

7. The lift mechanism of claim 6, wherein said actuator is a motor rotating a lead screw connected to said arm.

8. The lift mechanism of claim 1, further comprising a position sensor detecting a rotational position of a sensed element rotating with said lead nut and interacting with a sensor of said position sensor.

9. The lift mechanism of claim 1, including an actuator rotating said lead nut.

10. The lift mechanism of claim 9, wherein said actuator is a motor.

11. The lift mechanism of claim 10, wherein said motor rotates a motor gear having a toothed outer exterior surface engaged with a geared toothed outer exterior surface formed in said lead nut to thereby axially move the lead screw.

12. The lift mechanism of claim 9, wherein said actuator drives an arm connected to said lead nut by a force exerted perpendicularly to an axis of the rotary drive shaft.

13. The lift mechanism of claim 9, wherein said actuator is a motor rotating a lead screw connected to said arm.

14. The lift mechanism of claim 1, further comprising a scan mechanism including said rotary drive shaft for at least rotating said magnet assembly about a central axis of said target.

15. The lift mechanism of claim 14, wherein said lift mechanism lifts said scan mechanism.

16. The lift mechanism of claim 14, wherein said scan mechanism comprises a planetary mechanism for causing said magnetron to execute epicyclic motion in a plane and about said central axis.

17. In a magnetron sputter reactor including a chamber sealable to a sputtering target, a support within said chamber for holding a substrate to be processed, a magnetron placeable on a backside of said target opposite said support, and a cooling fluid enclosure on said backside of said target and enclosing said magnetron, a magnetron system comprising:
    said magnetron;
    a scan mechanism at least rotating said magnetron on said backside of said target about a central axis of said target through a rotation of a drive shaft penetrating and fluid sealed to said enclosure and displaceable along said axis; and
    a lift mechanism selectively and controllably moving said drive shaft along said axis from a motive force provided from an exterior of said enclosure and comprising a rotationally fixed lead screw and a lead nut threadably and rotatably engaged with said lead screw to allow the lead nut to rotate about the rotationally fixed lead screw;
    wherein said drive shaft passes axially through an interior of the fixed lead screw.

18. The magnetron system of claim 17, wherein said lead nut is axially fixed with respect to said enclosure.

19. The magnetron system of claim 18, wherein said lead screw is azimuthally fixed with respect to said enclosure and supports said drive shaft.

20. The magnetron system of claim 17, wherein the lead nut is rotatable.

21. The lift mechanism of claim 1, wherein the lead screw extends along and the lead nut rotates about a rotary axis of the rotary drive shaft.

22. The magnetron system of claim 17 wherein the lead screw extends along the central axis and the lead nut rotates about the central axis.

* * * * *